US009431077B2

United States Patent
Shacham et al.

(10) Patent No.: US 9,431,077 B2
(45) Date of Patent: Aug. 30, 2016

(54) DUAL HOST EMBEDDED SHARED DEVICE CONTROLLER

(71) Applicant: QUALCOMM Incorporated, San Diego, CA (US)

(72) Inventors: Assaf Shacham, Zichron Yaakov (IL); Amit Gil, Zichron Yaakov (IL); Erez Tsidon, Moreshet (IL); Yanru Li, San Diego, CA (US); Azzedine Touzni, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 257 days.

(21) Appl. No.: 13/798,803

(22) Filed: Mar. 13, 2013

(65) Prior Publication Data

US 2014/0281283 A1 Sep. 18, 2014

(51) Int. Cl.
*G06F 9/52* (2006.01)
*G06F 9/54* (2006.01)
(Continued)

(52) U.S. Cl.
CPC .......... *G11C 7/1075* (2013.01); *G06F 1/3225* (2013.01); *G06F 1/3275* (2013.01); *G06F 1/3296* (2013.01); *G06F 9/462* (2013.01); *G06F 9/463* (2013.01); *G06F 9/52* (2013.01); *G06F 9/544* (2013.01); *G06F 11/0757* (2013.01); *Y02B 60/1225* (2013.01); *Y02B 60/1228* (2013.01); *Y02B 60/1285* (2013.01)

(58) Field of Classification Search
CPC .......... G06F 9/52; G06F 9/544; G06F 9/462; G06F 9/463
See application file for complete search history.

(56) References Cited

U.S. PATENT DOCUMENTS 6,018,785 A   1/2000   Wenniger
6,163,831 A   12/2000  Kermani
(Continued)

FOREIGN PATENT DOCUMENTS

EP   1193611 A2   4/2002
WO   8404190 A1   10/1984
(Continued)

OTHER PUBLICATIONS

"What is a Register", Webopedia, http://www.webopedia.com/TERM/R/register.html.*
(Continued)

*Primary Examiner* — Edward Dudek, Jr.
(74) *Attorney, Agent, or Firm* — Withrow & Terranova, PLLC

(57) ABSTRACT

Efficient techniques using a multi-port shared non-volatile memory are described that reduce latency in memory accesses from dedicated function specific processors, such as a modem control processor. The modem processor preempts a host processor that is accessing data from a multi-port shared non-volatile memory flash device allowing the modem processor to quickly access data in the flash device. The preemption process uses a doorbell interrupt initiated by a processor that seeks access and interrupts the processor being preempted. After preemption, the host processor may resume or restart the data access. Access control by the processors utilizes a hardware semaphore atomic control mechanism. Power control of the shared non-volatile memory modules includes at least one inactivity timer to indicate when a supply voltage to the shared non-volatile memory modules can be safely reduced or turned off. Power may be restarted by any of the processors sharing the memory, allowing fast access to the data.

17 Claims, 5 Drawing Sheets

(51) Int. Cl.
*G11C 7/10* (2006.01)
*G06F 1/32* (2006.01)
*G06F 9/46* (2006.01)
*G06F 11/07* (2006.01)

(56) References Cited

U.S. PATENT DOCUMENTS

| | | | |
|---|---|---|---|
| 6,393,590 | B1 | 5/2002 | Wood et al. |
| 6,874,049 | B1 | 3/2005 | Wyland |
| 8,171,233 | B2 | 5/2012 | Kwon |
| 8,209,527 | B2 | 6/2012 | Im et al. |
| 2002/0133675 | A1 | 9/2002 | Hirayama |
| 2004/0034642 | A1 | 2/2004 | Szilagyi et al. |
| 2007/0060093 | A1 | 3/2007 | Kerth et al. |
| 2009/0157950 | A1* | 6/2009 | Selinger ............... 711/103 |
| 2010/0058001 | A1 | 3/2010 | Akaike et al. |
| 2010/0095089 | A1* | 4/2010 | Kwon ............... 712/30 |
| 2011/0035575 | A1 | 2/2011 | Kwon |
| 2012/0089861 | A1 | 4/2012 | Cardinell et al. |
| 2012/0102344 | A1 | 4/2012 | Kocev et al. |
| 2013/0042126 | A1 | 2/2013 | Ganesan et al. |
| 2014/0189693 | A1* | 7/2014 | Trumbull et al. ............. 718/101 |

FOREIGN PATENT DOCUMENTS

| | | |
|---|---|---|
| WO | 0036509 A2 | 6/2000 |
| WO | 2010077923 A2 | 7/2010 |
| WO | 2012134431 A1 | 10/2012 |

OTHER PUBLICATIONS

International Search Report and Written Opinion for PCT/US2014/021834, mailed Jul. 29, 2014, 23 pages.

Partial International Search Report—PCT/US2014/021834—ISA/EPO—Jun. 6, 2014.

International Preliminary Report on Patentability for PCT/US2014/021834, mailed Jun. 4, 2015, 43 pages.

Jayaraj, J. et al., "Shadow Register File Architecture: A Mechanism to Reduce Context Switch Latency," IEEE International Conference on High Performance Computing (HiPC), Dec. 18-22, 2002, Bangalore, India, retrieved Feb. 23, 2015 from http://www.hipc.org/hipc2002/2002Posters/ShadowRegister.pdf, 5 pages.

Second Written Opinion for PCT/US2014/021834, mailed Mar. 9, 2015, 10 pages.

* cited by examiner

DUAL HOST EMBEDDED SHARED DEVICE CONTROLLER

FIELD OF THE DISCLOSURE

The present disclosure relates generally to the field of multiprocessors and in particular to functions provided by a dual host shared device controller.

BACKGROUND

Many portable products, such as cell phones, laptop computers, personal data assistants (PDAs) and the like, utilize a processing system that executes programs, such as communication and multimedia programs. A processing system for such products may include multiple processors, complex memory systems including multi-levels of caches for storing instructions and data, controllers, peripheral devices such as communication interfaces, and fixed function logic blocks configured, for example, on a single chip.

In multiprocessor portable systems, including smartphones, tablets, and the like, an applications processor may be used to coordinate operations among a number of embedded processors. The host application processor may also provide an access port to storage elements such as embedded or removable non-volatile memory modules and disk drives. Other embedded processors may be dedicated to specific real-time operations, such as a modem control processor, an audio signal processor, or the like. Each of the embedded processors may operate their own file system which may have specific time constraints associated with its dedicated functions. Such a multiprocessor system may also be required to share memory storage, such as the embedded memory and removable non-volatile memory modules or disk drives. However, in a system where the shared non-volatile memory storage devices each have a single port accessible through a host control processor, excessive latency may be experienced in memory accesses from dedicated functions in specific processors due to increased interdependencies between subsystems and overhead of inter-process communication (IPC). Also, debug in such a system may become unacceptably complicated.

SUMMARY

Among its several aspects, the present disclosure recognizes that it is advantageous to provide more efficient methods and apparatuses for each embedded processor to be able to independently access a non-volatile memory directly, without centralizing accesses through an application processor. Also, it is advantageous to provide more efficient methods and apparatuses for handshaking and preempting operations of one processor by a second processor to handle time critical events. To such ends, an embodiment of the invention addresses a method for preempting a first processor by a second processor. A block of data is accessed by a first processor from a shared non-volatile memory device that is shared by direct access with the first processor and a second processor. A doorbell interrupt is issued to the first processor to request preemption of operations by the first processor on the shared non-volatile memory device. The block of data accesses by the first processor is preempted to initiate a memory access by the second processor.

Another embodiment addresses an apparatus allowing two processors to independently access a shared device. A first processor is coupled to the shared device and is configured to have exclusive access rights to a first set of shadow registers. A second processor is coupled to the shared device and is configured to have exclusive access rights to a second set of shadow registers. A shared device controller having a semaphore state machine is configured to map the first set of shadow registers to a shared address space upon granting a semaphore to the first processor and to map the second set of shadow registers to the shared address space upon granting the semaphore to the second processor.

Another embodiment addresses a method for two processors to independently access a shared device. A first shadow register is mapped to a shared address in response to acquisition of a semaphore by a first processor, wherein the first processor writes a first value to the first shadow register at the shared address. The first shadow register is removed from its link to the shared address in response the semaphore being released at completion of a first operation to a shared device by the first processor. A second shadow register is mapped to the shared address in response to acquisition of the semaphore by a second processor, wherein the second processor writes a second value to the second shadow register at the shared address. The second shadow register is removed from its link to the shared address in response to the semaphore being released at completion of a second operation to the shared device by the second processor, wherein the first value is unchanged in the first shadow register and the second value is unchanged in the second shadow register at completion of the second operation.

Another embodiment addresses a method for power control. A supply voltage to a memory device under control of a first processor and shared by a plurality of processors is reduced in response to receiving an indication of a lack of accesses to the memory device. The supply voltage is returned to operating level under control of the first processor in response to receiving a memory access request by another processor of the plurality of processors.

Another embodiment addresses a computer readable non-transitory medium encoded with computer readable program data and code. A first shadow register is mapped to a shared address in response to acquisition of a semaphore by a first processor, wherein the first processor writes a first value to the first shadow register at the shared address. The first shadow register is removed from its link to the shared address in response the semaphore being released at completion of a first operation to a shared device by the first processor. A second shadow register is mapped to the shared address in response to acquisition of the semaphore by a second processor, wherein the second processor writes a second value to the second shadow register at the shared address. The second shadow register is removed from its link to the shared address in response to the semaphore being released at completion of a second operation to the shared device by the second processor, wherein the first value is unchanged in the first shadow register and the second value is unchanged in the second shadow register at completion of the second operation.

Another embodiment addresses a computer readable non-transitory medium encoded with computer readable program data and code. A block of data is accessed by a first processor from a shared non-volatile memory device that is shared by direct access with the first processor and a second processor. A doorbell interrupt is issued to the first processor to request preemption of operations by the first processor on the shared non-volatile memory device. The block of data accesses by the first processor is preempted to initiate a memory access by the second processor.

A further embodiment addresses an apparatus allowing two processors to independently access a shared device. Means is utilized for a first processor to access the shared device and to have exclusive access rights to a first set of shadow registers. Means is utilized for a second processor to access the shared device and to have exclusive access rights to a second set of shadow registers. Means is utilized for a shared device controller to map the first set of shadow registers to a shared address space upon granting a semaphore to the first processor and to map the second set of shadow registers to the shared address space upon granting the semaphore to the second processor.

It is understood that other embodiments of the present invention will become readily apparent to those skilled in the art from the following detailed description, wherein various embodiments of the invention are shown and described by way of illustration. As will be realized, the invention is capable of other and different embodiments and its several details are capable of modification in various other respects, all without departing from the spirit and scope of the present invention. Accordingly, the drawings and detailed description are to be regarded as illustrative in nature and not as restrictive.

BRIEF DESCRIPTION OF THE DRAWINGS

Various aspects of the present invention are illustrated by way of example, and not by way of limitation, in the accompanying drawings, wherein.

DETAILED DESCRIPTION

Figure 1:
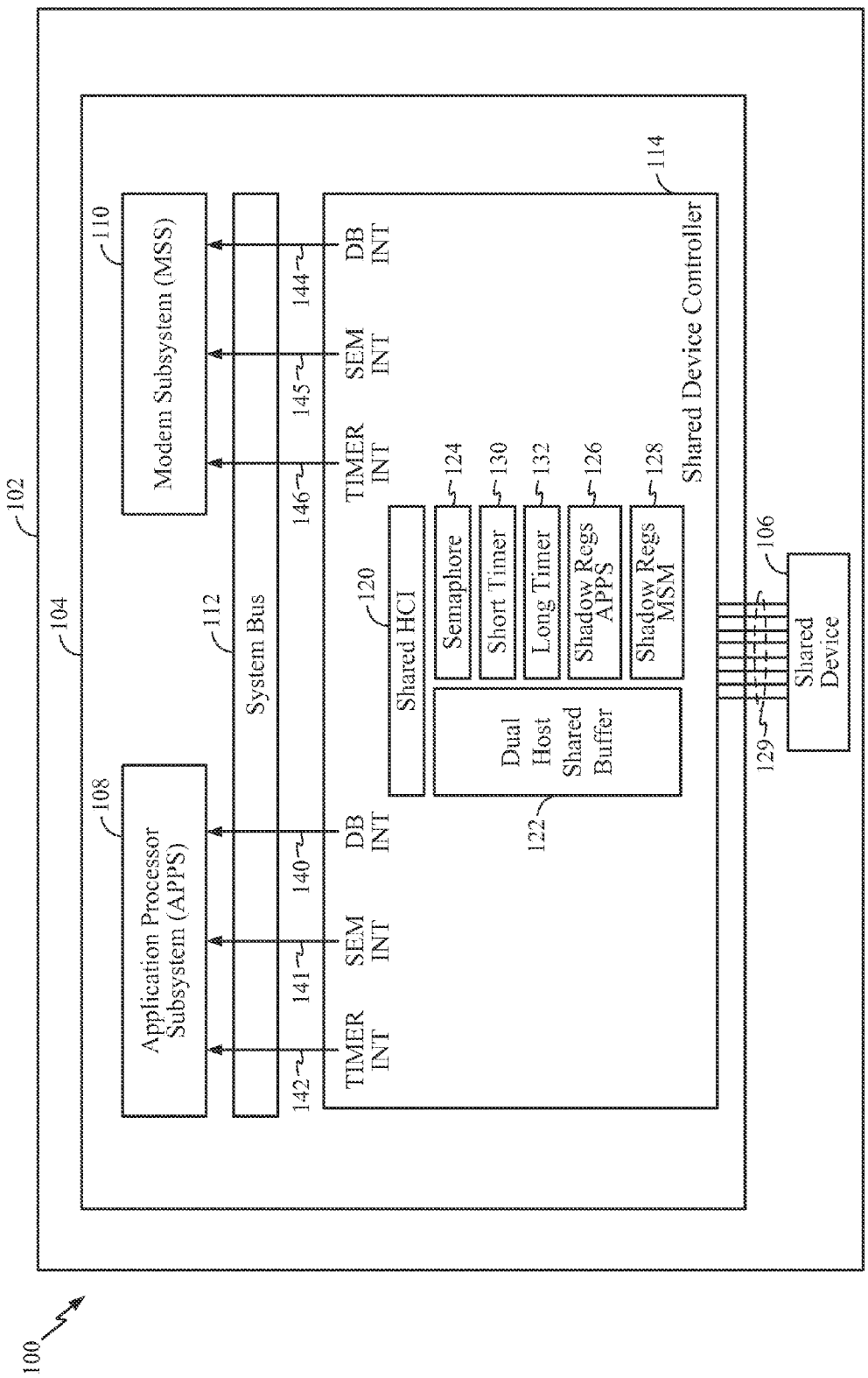
FIG. 1 illustrates an embodiment of a multiprocessor subsystem that meets real-time constraints in a modem subsystem that may be advantageously employed.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well known structures and components are shown in block diagram form in order to avoid obscuring the concepts of the present invention.

To address such problems as excessive latency in memory accesses from dedicated function specific processors, a multi-port memory software and hardware design may be implemented for the shared non-volatile memory modules. For example, a dedicated processor with critical latency requirements, such as a modem control processor, may have access to a second memory port separate from a host control processor's memory access port. By not requiring the modem control processor to pipe accesses through the host control processor in the single access port design, the multi-port design reduces latency of accessing data from the shared non-volatile memory modules and thus avoids a time consuming inter-process communication (IPC) procedure.

In addition, demand paging and other such fast access techniques may be used by multiple processors that share the memory modules. For example, a system operation scenario may include the host control processor accessing a large block of data from a removable memory module when a time critical event occurs in the modem processor. In the multi-port memory system, the modem processor preempts the host control processor allowing the modem processor fast access to data in the removable memory module, thereby reducing memory access time for the time critical event. Preemption may advantageously use a doorbell interrupt requested by the processor seeking access and initiated in the processor being preempted. The use of the doorbell interrupt enables a much faster response from the application process, as compared to a significant amount of IPC required without a doorbell interrupt. Also, shared non-volatile memory parameters, such as device status and operating mode information, may be stored in a separate memory accessible by the processor seeking access for use after access has been granted. After preemption, access rights are given back to the application (host control) processor and the host control processor may resume access or may restart access of the large block of data. Access control by the processors utilizes a hardware supported semaphore atomic control mechanism as described in more detail below.

Access requests between multiple processors may also be buffered, using a first in first out (FIFO) memory, or priority queue, for example, providing hardware support for faster switching between processors for memory access. Power control of the shared non-volatile memory modules includes at least one inactivity timer to indicate when a supply voltage to the shared non-volatile memory modules can be safely reduced or turned off. Power may be restarted by any of the processors sharing the memory, allowing fast access to the data. A second inactivity timer of different length may be used to support an error recovery procedure. In a multi-processor system, with a processor that has a semaphore lock to access a shared non-volatile memory device and an indication is received in a control processor that the second inactivity timer has timed out, the control processor initiates an error recovery procedure to the non-volatile memory controller to free access to the shared non-volatile memory device. The processor that had the semaphore lock is reset, the semaphore lock is released, and, optionally, the shared non-volatile memory device is reinitialized.

Embodiments of the invention may be suitably employed in a processor having a modem subsystem. FIG. 1 illustrates an embodiment of a multiprocessor subsystem 100 that meets real-time constraints in a modem subsystem. The multiprocessor subsystem 100 includes a device system core 102 which includes a subsystem controller 104 and a shared device 106, such as a flash memory, a disk drive, or other device shared between two or more processors. The subsystem controller 104 includes an application processor subsystem (APPS) 108, a modem subsystem (MSS) 110 configured with an MSS processor, a system bus 112, and a shared device controller 114, such as a flash controller. The APPS 108 may be configured with one, two, or more processors according to requirements of a product. The APPS 108 and MSS 110 access the shared device 106 over the system bus 112 and as controlled by the shared device controller 114. The shared device 106 may also include a removable flash memory or may also be an embedded memory. It is noted that the shared device 106 may be integrated with subsystem controller 104 in the device system core 102.

The shared device controller 114 contains a shared host controller interface (HCI) 120, a dual host shared buffer 122, a plurality of atomic access semaphores 124, APPS shadow registers 126, MSS shadow registers 128, an access path 129 to the shared device 106, a short timer 130, and a long timer 132 which are described in more detail below. Interrupt (INT) signals for the APPS include a doorbell interrupt (DB INT) 140, a semaphore interrupt (SEM INT) 141, and a timer interrupt (TIM INT) 142. Interrupt (INT) signals for the MSS include a doorbell interrupt (DB INT) 144, a semaphore interrupt (SEM INT) 145, and a timer interrupt (TIM INT) 146. The shared HCI 120 provides access to a set of shared registers and to the two shadow register sets (126 and 128) using a single address region. The semaphore governs which shadow register set is mapped to the HCI address region at any given time. Each processor issues transactions using the same address space.

The application processor subsystem (APPS) 108 has exclusive access rights to the APPS shadow registers 126 and the modem subsystem (MSS) 110 has exclusive access rights to the MSS shadow registers 128. For example, access controls in the APPS 108 and in the MSS 110 may be set up to provide means to enforce the exclusive access rights. In an alternative embodiment, the APPS shadow registers 126 may be configured with an access path only to the APPS 108 and the MSS shadow registers 128 may be configured with an access path only to the MSS 110, thus providing the means to enforce the exclusive access rights. In either case, means are provided such that the APPS 108 shall not access the MSS shadow registers 128 and the MSS 110 shall not access the APPS shadow registers 126. The semaphore further enforces this rule governing access to the shadow registers. Advantageously, each processor that has direct access to the shared device 106, such as a non-volatile memory, is configured with a corresponding access control mechanism to guarantee exclusive access rights.

The short inactivity timer 130 is used to generate an interrupt for error recovery when an expected response from either the APPS 108 or from the MSS 110 is excessively delayed. For example, when the APPS 108 attempts to acquire the semaphore, but the MSS 110 fails to release it after some time, such as 100 ms, this lack of receiving the expected response is an indication that MSS software is not responsive for the current task. In that case, the short inactivity timer 130 expires, indicating to the APPS 108 that an error recovery procedure is required. The long inactivity timer 132 is used to generate an interrupt for power control when the shared device controller 114 indicates a not busy state for a long count period, such as five seconds. Whenever the shared device controller 114 becomes busy, the long inactivity timer is reset and the count period is restarted. After a long count period has been reached the shared device controller 114 and shared device 106 are placed in a low power state. Access by either the APPS 108 or by the MSS 110 brings power back up for the shared device controller 114 and for the shared device 106.

Figure 2A:
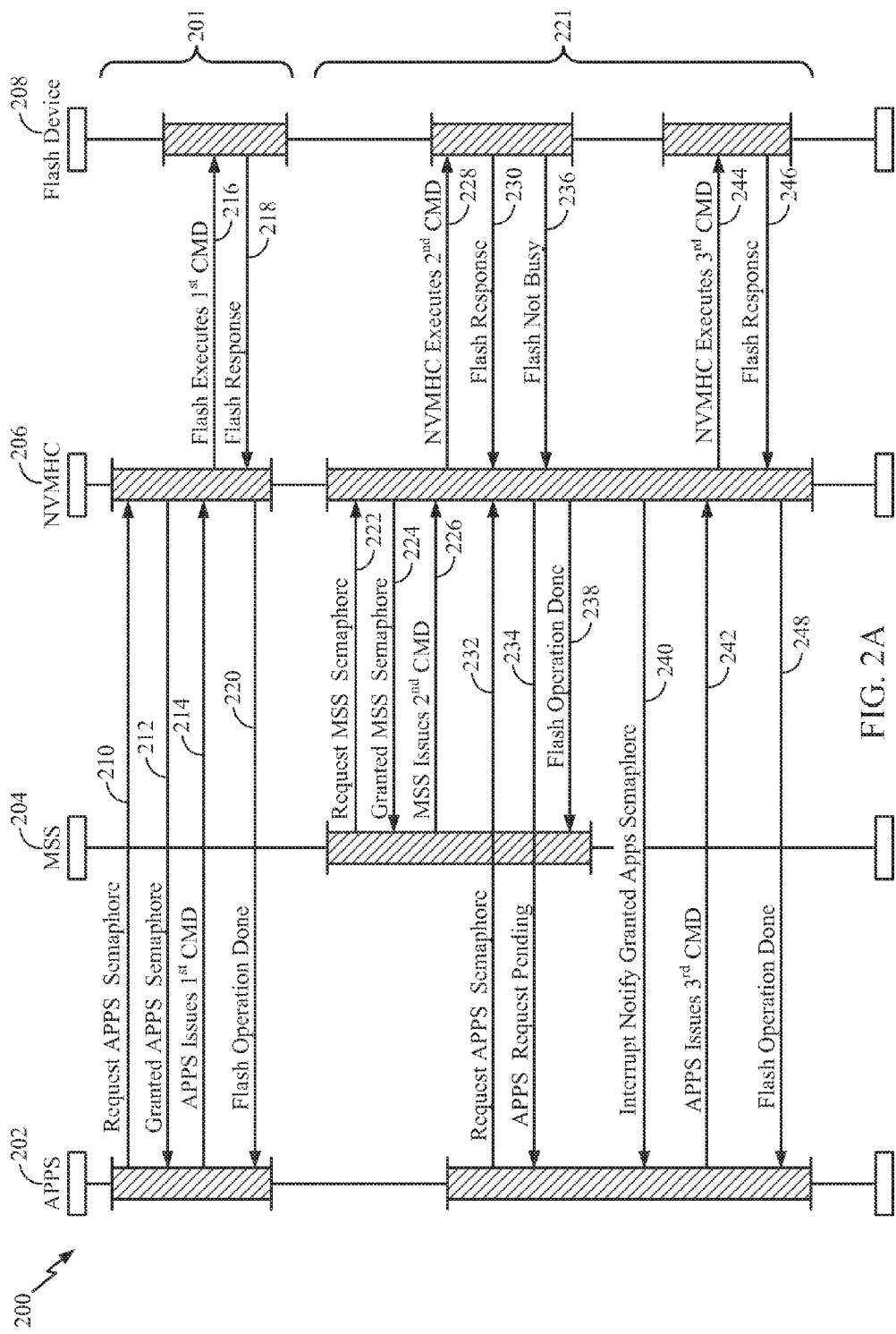
FIG. 2A illustrates an embodiment for a process of accessing data in a multiprocessor data transaction.

FIG. 2A illustrates an embodiment for a process 200 of accessing data in multiprocessor data transactions. The process 200 is illustrated in a sequence of transactions between an application processor subsystem (APPS) 202 and a non-volatile memory host controller (NVMHC) 206, between a modem subsystem (MSS) 204 and the NVMHC 206, and between the NVHMC 206 and a flash device 208.

The APPS 202 accesses the NVMHC 206 through shared registers and the APPS shadow registers 126, and the MSS 204 accesses the NVMHC 206 through the shared registers and the MSS shadow registers 128. Generally, control accesses are accomplished through the shadow registers, but in some modes, data may be transferred through the shadow registers as well. For the transactions illustrated in FIGS. 2A and 2B, it is assumed that the devices have been initialized, are operational, and are not in a reduced power mode. Also, the shared buffer 122 is populated with initialized data that could be required for the subsequent transactions. The flash device 208 is either an embedded flash memory or a removable secure data card with embedded flash memory.

A first set of transactions 201 is shown for data transactions between the APPS 202 and the flash device 208. At transaction 210, the APPS 202 sends a request to the NVMHC 206 to acquire a semaphore. At transaction 212, the NVMHC 206 grants the semaphore request and sends a response to the APPS 202 indicating the semaphore has been acquired. At transaction 214, the APPS 202 sends a first command ($1^{st}$ CMD) to the NVMHC 206 to initiate an operation with the flash device 208. At transaction 216, the NVMHC 206 executes the first command, such as a read data command, with the flash device 208. At transaction 218, the flash device 208 begins responding to the NVMHC 206 with the requested data. At transaction 220, after all the requested data has been read, the NVMHC 206 sends a flash operation done message to the APPS 202.

A second set of transactions 221 is shown for data transactions between the MSS 204 and the flash device 208 with the APPS 202 attempting to acquire an access semaphore for a low priority command while the MSS 204 transactions are occurring. At transaction 222, the MSS 204 sends a request to the NVMHC 206 to acquire a semaphore. At transaction 224, the NVMHC 206 grants the semaphore request and sends a response to the MSS 204 indicating the semaphore has been acquired. At transaction 226, the MSS 204 sends a second command ($2^{nd}$ CMD) to the NVMHC 206 to initiate an operation with the flash device 208. At transaction 228, the NVMHC 206 executes the second command, such as a read data command, with the flash device 208. At transaction 230, the flash device 208 begins responding to the NVMHC 206 with the requested data. At transaction 232, the APPS 202 sends a low priority request to the NVMHC 206 to acquire a semaphore. At transaction 234, an APPS message is sent back to the APPS 202 indicating the APPS request for a semaphore cannot be granted now and is in a pending state since the MSS 204 has priority over the low priority APPS request and in this case the MSS 204 cannot be preempted. At transaction 236, the flash device 208 having completed the requested data responds with a not busy message to the NVMHC 206. At transaction 238, after all the requested data has been read, the NVMHC 206 sends a flash device operation done message to the MSS 204. At transaction 240, the NVMHC 206 grants the pending APPS semaphore request and issues an interrupt to notify the APPS 202 of the pending APPS access semaphore has been acquired. At transaction 242, the APPS sends a third command ($3^{rd}$ CMD) to the NVMHC 206. At transaction 244, the NVMHC 206 executes the third command, such as a read data command to the flash device 208. At transaction 246, the flash device begins responding to the NVMHC 206 with the requested data. At transaction 248, after all the requested data has been read, the NVMHC 206 sends a flash operation done message to the APPS 202.

Figure 2B:
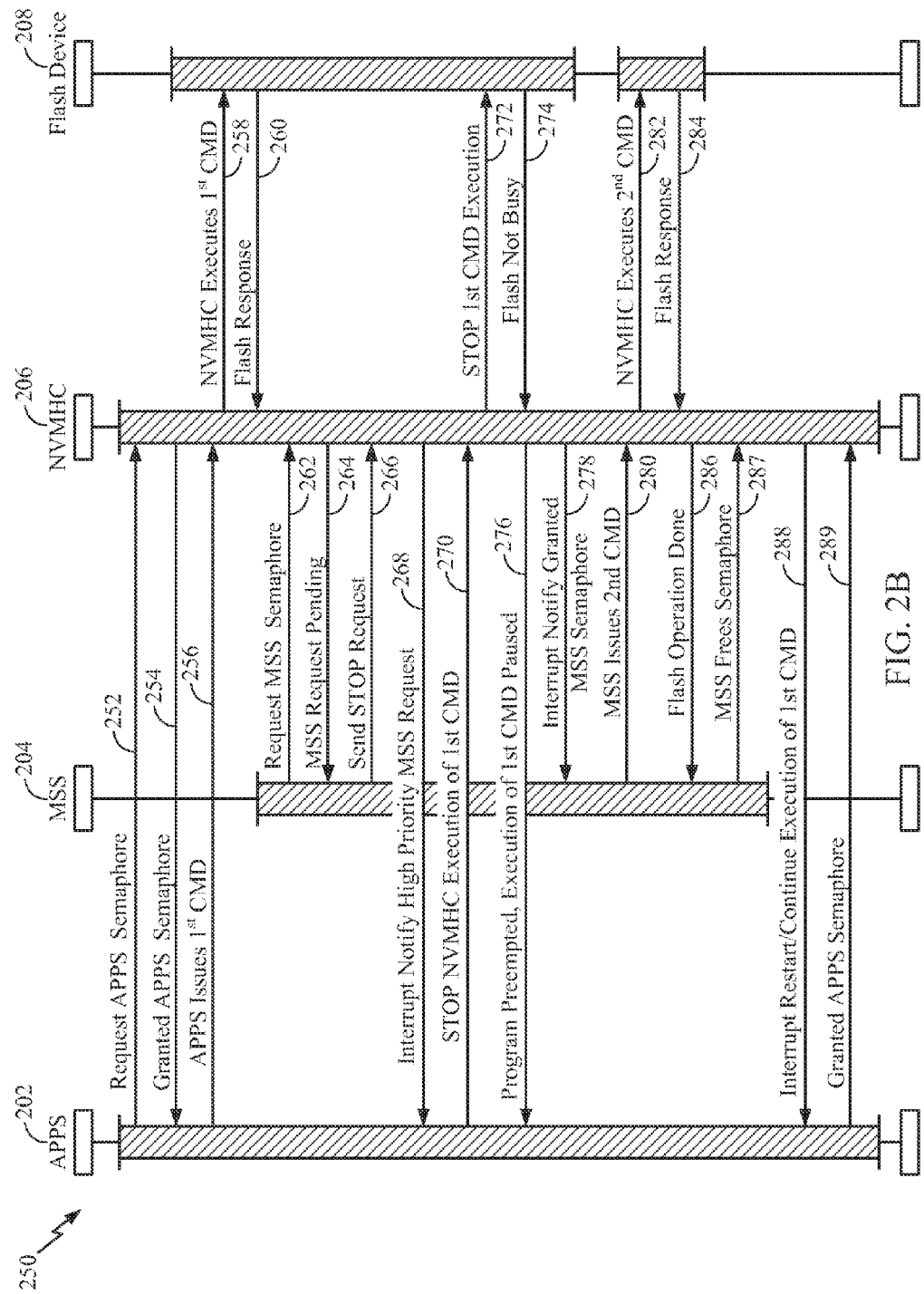
FIG. 2B illustrates an embodiment for a process of preempting a data transaction in the multiprocessor subsystem in order to service a real-time task.

FIG. 2B illustrates an embodiment for a process 250 of preempting a data transaction in the multiprocessor subsystem in order to service a real-time task. The process 250 is illustrated in a sequence of transactions between an application processor subsystem (APPS) 202 and a secure digital card or non-volatile memory host controller (NVMHC) 206 and flash device 208 which is interrupted by a high priority request by the modem subsystem (MSS) 204. For these transactions, it is assumed that the devices have been initialized, are operational, and are not in a reduced power mode. The flash device 208 is either an embedded flash memory or a removable secure data card with embedded flash memory. At transaction 252, the APPS 202 sends a request to the NVMHC 206 to acquire a semaphore. At transaction 254, the NVMHC 206 grants the semaphore request and sends a response to the APPS 202 indicating the semaphore has been acquired. At transaction 256, the APPS 202 sends a first command ($1^{st}$ CMD) to the NVMHC 206 to initiate an operation with the flash device 208. At transaction 258, the NVMHC 206 executes the first command, such as a read data command, with the flash device 208. At transaction 260, the flash device 208 begins responding to the NVMHC 206 with the requested data.

At transaction 262 and prior to completing the APPS data transactions, the MSS 204 sends a request to the NVMHC 206 to acquire a semaphore. At transaction 264, a message is sent back to the MSS 204 indicating the MSS request for a semaphore cannot be granted now and is in a pending state. At transaction 266, the MSS 204 sends a stop request to the NVMHC 206, since the MSS 204 is attempting a high priority access of the flash device 208. At transaction 268, the NVMHC 206 sends a high priority interrupt, referred to as a doorbell interrupt, to the APPS 202 to notify it of the high priority MSS request. At transaction 270, the APPS 202 responds to the doorbell interrupt and sends a message to the NVMHC 206 to stop the execution of the first command. At transaction 272, the NVMHC 206 stops the first command execution. At transaction 274, the flash device 208 indicates it is not busy. At transaction 276, the NVMHC 206 sends a message to the APPS 202 that the program has been preempted and the execution of the first command has been paused. At transaction 278, the NVMHC 206 issues a doorbell interrupt to the MSS 204 to notify the MSS 204 that it has acquired the pending semaphore. At transaction 280, the MSS 204 sends a second command ($2^{nd}$ CMD) to the NVMHC 206. At transaction 282, the NVMHC 206 executes the second command, such as a read data command, with the flash device 208. At transaction 284, the flash device 208 begins responding to the NVMHC 206 with the requested data. At transaction 286 and after completing the requested data transactions, the NVMHC 206 sends a flash operation is done to the MSS 204 and the MSS frees the semaphore at transaction 287. At transaction 288, the NVMHC 206 issues an interrupt to the APPS 202 that it should restart or continue with the execution of the first command. The APPS 202 responds to a granted semaphore at transaction 289 and in one embodiment the APPS 202 restarts the first command from the beginning and in a different embodiment the APPS continues with execution of the first command from the point where it was preempted at transaction 276.

Figure 3:
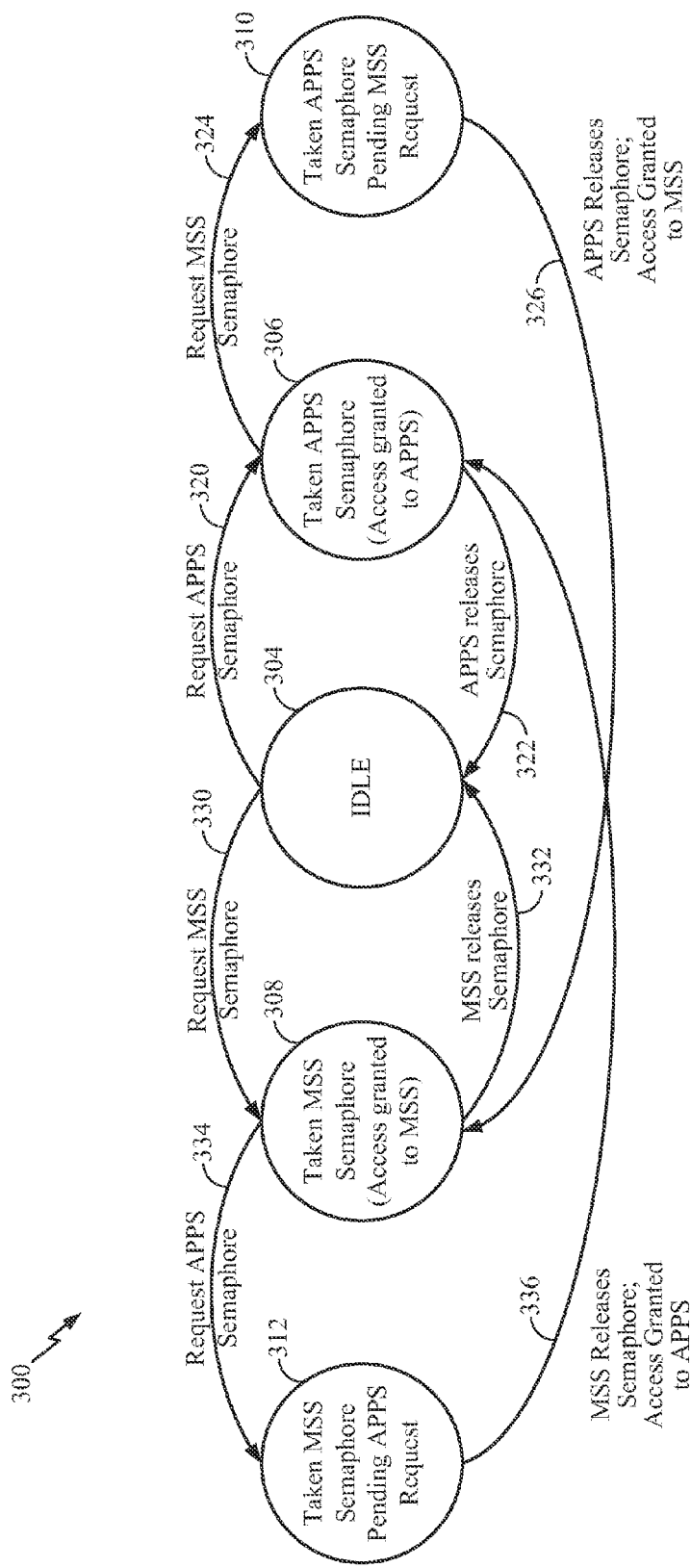
FIG. 3 illustrates an embodiment for a semaphore state machine supporting preemption of data transactions in order to service a real-time task.

FIG. 3 illustrates an embodiment for a semaphore state machine 300 supporting preemption of data transactions in order to service a real-time task. The semaphore state machine 300 governs the access to the shared device controller 114 by the APPS 108 and the MSS 110. When the state machine 300 is in IDLE state 304, either the APPS 108 or the MSS 110 can acquire controlling access to the state machine 300 and thereby gaining access to the shared device controller 114. The state machine 300 transitions to a taken state, such as taken APPS semaphore state 306 or taken MSS semaphore state 308, by receiving a request from either the APPS 108 or the MSS 110. When the state machine 300 is in the state 306 or the state 308 and the other host attempts acquisition to preempt an existing operation on the other host, for example, the state machine 300 transitions to a taken and pending state, such as taken APPS semaphore and pending MSS request state 310 or taken MSS semaphore and pending APPS request state 312. For example, with the state machine 300 in the taken APPS semaphore state 306, upon accepting a request from the MSS, the state machine 300 transitions to the corresponding taken APPS semaphore and pending MSS request state 310. In that state 310, when the APPS holding the semaphore releases it, the state machine 300 transitions 326 to the taken MSS semaphore state 308. This state machine 300 is employed to accelerate the hand-off of control between the two hosts.

The transitions of FIG. 2B may be correlated to state transitions shown in the state machine 300 of FIG. 3. For example, the APPS 202 requests a semaphore transaction 252 corresponds to transition 320 and the APPS 202 acquiring the semaphore indicated by granted APPS semaphore transaction 254 corresponds to state 306. The MSS 204 attempts acquisition with the request MSS semaphore transaction 262 which corresponds to transition 324. Since the request is not immediately accepted, an MSS request pending transaction 264 occurs which corresponds to state 310. The semaphore is granted to the MSS 204 at transaction 278 which corresponds to transition 326. Continuing, the MSS 204 frees the semaphore at transaction 287 corresponds to transition 332 back to idle state 304. The APPS 202 responds to a granted semaphore at transaction 289 corresponds to transition 320 to taken APPS semaphore state 306. In a similar manner, the MSS 204 requests a semaphore from the idle state 304 corresponds to transition 330 and the MSS 204 acquiring the semaphore corresponds to state 308. The APPS 202 attempts acquisition which corresponds to transition 334. If the request is not immediately accepted, the system stays in a taken MSS semaphore with an APPS request pending in state 312. When the APPS request is granted, the MSS 204 releases the semaphore and access is granted to the APPS 202 corresponding to transition 336 to state 306 indicating the APPS 202 has taken the semaphore.

Regarding shadow registers, the NVMHC 206 includes a number of registers which software expects to configure once, for example on initialization of an application, and rely that their values remains unchanged during operations of the application. In a multiple host processor scenario, each host processor may want to assign different values to the same registers, while expecting them to keep those values. To address the providing of such storage capacity, a set of shadow registers are assigned to each host. Each host's set of shadow registers are mapped to a single address space as controlled by a semaphore. When a semaphore is granted to a host A, a shadow set of registers A is made accessible to host A software, with the values previously configured by host A. At a later time, when a semaphore is granted to host B, a shadow set of registers B is made accessible to host B software, while the shadow set of registers A is stored for future use. For example, an APPS set of shadow registers and an MSS set of shadow registers are reset to the same initial state. The set of shadow registers that are made accessible to software for both read and write accesses is determined by the state of the semaphore. When the APPS acquires the semaphore, the value of the APPS shadow registers are mapped to the address space visible to APPS software by multiplexing means such as a hardware multiplexer within the shared device controller 114. The semaphore controls the hardware multiplexer such that when APPS acquires the semaphore, the multiplexer makes the APPS shadow registers visible to the APPS software and when MSS acquires the semaphore, means are provided by the hardware multiplexer to make the MSS shadow registers visible to MSS software. Thus, means are provided for a first processor, the APPS, to access the shared device and to have exclusive access rights to a first set of shadow registers and means for a second processor, the MSS, to access the shared device and to have exclusive access rights to a second set of shadow registers. The APPS software may read a value, reconfigure any value, or leave the value unchanged within its APPS shadow registers. When the MSS software later acquires the semaphore, the stored values of the MSS shadow registers are mapped to the address space visible to MSS software and the APPS shadow registers become inaccessible. Thus, means are provided for a shared device controller to map the first set of shadow registers to a shared address space upon granting a semaphore to the first processor, APPS, and to map the second set of shadow registers to the shared address space upon granting the semaphore to the second processor, MSS. If the semaphore is in an idle state, the APPS shadow registers may be mapped to the address space and may be accessible to APPS software as a default setting.

The following table illustrates use of the shadow registers in a scenario of three data transfers that begin with the APPS transferring data first, followed by the MSS transferring data second, and then the APPS transferring data third.

1. APPS acquires the semaphore
2. APPS writes to an address mapped register to set a DMA channel to #5, the address mapped register is an APPS shadow register
3. APPS executes a data transfer transaction which uses DMA channel #5
4. APPS releases the semaphore
5. MSS acquires the semaphore
6. MSS writes to the same address mapped register to set the DMA channel to #7, the address mapped register is an MSS shadow register
7. MSS executes a data transfer transaction which uses DMA channel #7
8. MSS releases the semaphore
9. APPS acquires the semaphore
10. APPS executes a data transfer transaction which uses DMA channel #5, APPS assumes the DMA channel is still set to channel #5 and does not write to the address mapped register or read it
11. APPS releases the semaphore In the above scenario, if the MSS reacquires the semaphore after step 11, the MSS shadow register storing the DMA channel #7 is mapped to the shared address space and the MSS software would not have to rewrite the DMA channel unless the MSS software is programmed to change the DMA channel. This saving of host specific settings is maintained with other shadow registers mapped to the same address space. Such control registers do not have to be reconfigured for every transaction with the non-volatile memory or any other device shared between the two host processors.

Figure 4:
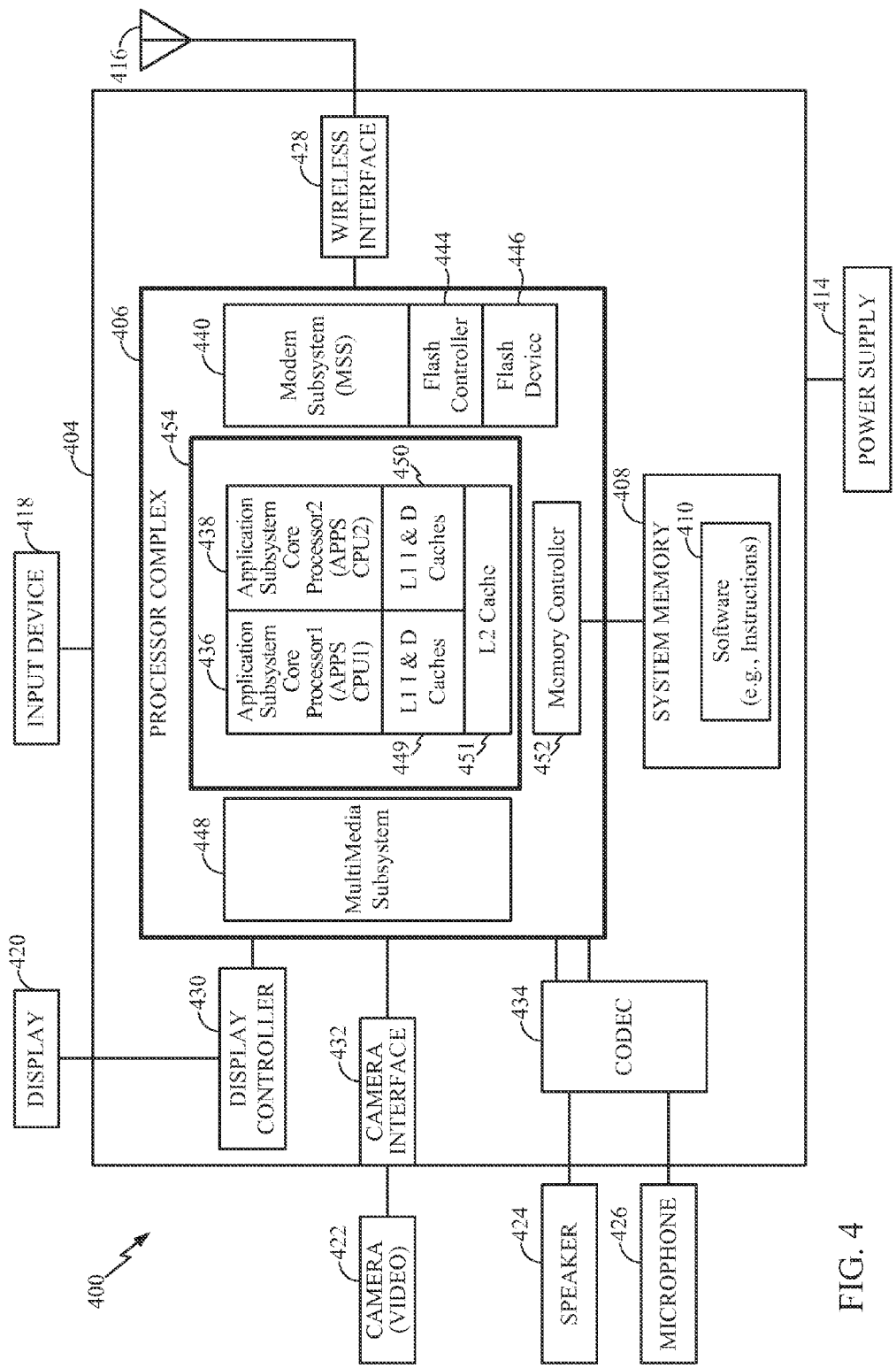
FIG. 4 illustrates a portable device having a processor complex that is configured to meet real-time requirements of a modem subsystem.

FIG. 4 illustrates a portable device 400 having a processor complex that is configured to meet real-time requirements of a modem subsystem. The portable device 400 may be a wireless electronic device and include a system core 404 which includes a processor complex 406 coupled to a system memory 408 having software instructions 410. The portable device 400 comprises a power supply 414, an antenna 416, an input device 418, such as a keyboard, a display 420, such as a liquid crystal display LCD, one or two cameras 422 with video capability, a speaker 424 and a microphone 426. The system core 404 also includes a wireless interface 428, a display controller 430, a camera interface 432, and a codec 434. The processor complex 406 may include a dual core arrangement of an application processor subsystem (APPS) 454 which includes two central processing units, APPS CPU1 436 having local level 1 instruction and data (L1 I & D) caches 449 and APPS CPU2 438 having local level 1 instruction and data (L1 I & D) caches 450. The APPS 454 may correspond to the APPS 108 of FIG. 1. The processor complex 406 may also include a modem subsystem 440, a flash controller 444, a flash device 446, a multimedia subsystem 448, a level 2 cache 451, and a memory controller 452. The flash device 446 may include a removable flash memory or may also be an embedded memory. The modem subsystem 440 may correspond to the MSS 110 of FIG. 1, the flash controller 444 may correspond to the shared device controller 114 of FIG. 1 and the flash device 446 may correspond to the shared device 106 of FIG. 1.

In an illustrative example, the system core 404 operates in accordance with any of the embodiments illustrated in or associated with FIGS. 1, 2A, 2B, and 3. For example, as shown in FIG. 4, the APPS 454 dual core processors are configured to access data or program instructions stored in the memories of the L1 I & D caches of their associated dual core processor, the L2 cache 451, and in the system memory 408 to provide data transactions as illustrated in FIGS. 2A and 2B.

The wireless interface 428 may be coupled to the processor complex 406 and to the wireless antenna 416 such that wireless data received via the antenna 416 and wireless interface 428 can be provided to the MSS 440 and shared with APPS 454. The camera interface 432 is coupled to the processor complex 406 and also coupled to one or more cameras, such as a camera 422 with video capability. The display controller 430 is coupled to the processor complex 406 and to the display device 420. The coder/decoder (CODEC) 434 is also coupled to the processor complex 406. The speaker 424, which may comprise a pair of stereo speakers, and the microphone 426 are coupled to the CODEC 434. The peripheral devices and their associated interfaces are exemplary and not limited in quantity or in capacity. For example, the input device 418 may include a universal serial bus (USB) interface or the like, a QWERTY style keyboard, an alphanumeric keyboard, and a numeric pad which may be implemented individually in a particular device or in combination in a different device.

The APPS 454 are configured to execute software instructions 410 that are stored in a non-transitory computer-readable medium, such as the system memory 408, and that are executable to cause a computer, such as the dual core processors 436 and 438, to execute a program to provide data transactions as illustrated in FIGS. 2A and 2B B. The APPS CPU1 436 and APPS CPU2 438 are configured to execute the software instructions 410 that are accessed from the different levels of cache memories and the system memory 408.

In a particular embodiment, the system core 404 is physically organized in a system-in-package or on a system-on-chip device. In a particular embodiment, the system core 404, organized as a system-on-chip device, is physically coupled, as illustrated in FIG. 4, to the power supply 414, the wireless antenna 416, the input device 418, the display device 420, the camera or cameras 422, the speaker 424, the microphone 426, and may be coupled to a removable flash device 446.

The portable device 400 in accordance with embodiments described herein may be incorporated in a variety of electronic devices, such as a set top box, an entertainment unit, a navigation device, a communications device, a personal digital assistant (PDA), a fixed location data unit, a mobile location data unit, a mobile phone, a cellular phone, a computer, a portable computer, tablets, a monitor, a computer monitor, a television, a tuner, a radio, a satellite radio, a music player, a digital music player, a portable music player, a video player, a digital video player, a digital video disc (DVD) player, a portable digital video player, any other device that stores or retrieves data or computer instructions, or any combination thereof.

The various illustrative logical blocks, modules, circuits, elements, or components described in connection with the embodiments disclosed herein may be implemented or performed with a general purpose processor, a digital signal processor (DSP), an application specific integrated circuit (ASIC), a field programmable gate array (FPGA) or other programmable logic components, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing components, for example, a combination of a DSP and a microprocessor, a plurality of microprocessors, one or more microprocessors in conjunction with a DSP core, or any other such configuration appropriate for a desired application.

The APPS 108 of FIG. 1 or the dual core processors 436 and 438 of FIG. 4, for example, may be configured to execute instructions to allow preempting a data transaction in the multiprocessor system in order to service a real-time task under control of a program. The program stored on a computer readable non-transitory storage medium either directly associated locally with processor complex 406, such as may be available through the instruction caches, or accessible through a particular input device 418 or the wireless interface 428. The input device 418 or the wireless interface 428, for example, also may access data residing in a memory device either directly associated locally with the processors, such as the processor local data caches, or accessible from the system memory 408. The methods described in connection with various embodiments disclosed herein may be embodied directly in hardware, in a software module having one or more programs executed by a processor, or in a combination of the two. A software module may reside in random access memory (RAM), dynamic random access memory (DRAM), synchronous dynamic random access memory (SDRAM), flash memory, read only memory (ROM), erasable programmable read only memory (EPROM), electrically erasable programmable read only memory (EEPROM), hard disk, a removable disk, a compact disk (CD)-ROM, a digital video disk (DVD) or any other form of non-transitory storage medium known in the art. A non-transitory storage medium may be coupled to the processor such that the processor can read information from, and write information to, the storage medium. In the alternative, the storage medium may be integral to the processor.

While the invention is disclosed in the context of illustrative embodiments for use in processor systems, it will be recognized that a wide variety of implementations may be employed by persons of ordinary skill in the art consistent with the above discussion and the claims which follow below. For example, a fixed function implementation may also utilize various embodiments of the present invention.

What is claimed is:

1. A method for preempting a first processor by a second processor, the method comprising:
   performing data accesses by a first processor from a non-volatile memory device that is shared by direct access with the first processor and a second processor;
   issuing a doorbell interrupt to the first processor to request preemption of operations by the first processor on the shared non-volatile memory device; and
   preempting the data accesses by the first processor to initiate a memory access by the second processor;
   wherein:
      the first processor is configured to access a first set of shadow registers to which the first processor is configured to have exclusive access rights, each shadow register of the first set of shadow registers comprising an address mapped register configured to be linked to a shared address space such that accesses to the address mapped register are mapped to the shared address space;
      the second processor is configured to access a second set of shadow registers to which the second processor is configured to have exclusive access rights, each shadow register of the second set of shadow registers comprising an address mapped register configured to be linked to the shared address space such that accesses to the address mapped register are mapped to the shared address space;
      performing the data accesses by the first processor comprises accessing the first set of shadow registers; and
      initiating the memory access by the second processor comprises accessing the second set of shadow registers.

2. The method of claim 1, wherein the shared non-volatile memory device is a flash drive or a disk drive.

3. The method of claim 1, wherein a separate memory, shared by the first processor and by the second processor, stores memory parameters required by the first or second processor which are granted access to the shared non-volatile memory device to properly access data.

4. The method of claim 1, further comprising:
   completing the memory access by the second processor; and
   resuming the data accesses by the first processor.

5. The method of claim 1, further comprising:
   granting a semaphore lock to the second processor to begin the memory access to the shared non-volatile memory device; and
   returning the semaphore lock to the first processor to resume the data accesses after the second processor has completed the memory access.

6. An apparatus allowing two processors to independently access a shared device, the apparatus comprising:
   a shared device controller comprising:
      a shared address space;
      a first set of shadow registers, each shadow register of the first set of shadow registers comprising an address mapped register configured to be linked to the shared address space such that accesses to the address mapped register are mapped to the shared address space; and
      a second set of shadow registers, each shadow register of the second set of shadow registers comprising an address mapped register configured to be linked to the shared address space such that accesses to the address mapped register are mapped to the shared address space;
a first processor coupled to a shared device via the shared device controller and configured to have exclusive access rights to the first set of shadow registers; and
a second processor coupled to the shared device via the shared device controller and configured to have exclusive access rights to the second set of shadow registers;
the shared device controller having a semaphore state machine configured to map the first set of shadow registers to the shared address space upon granting a semaphore to the first processor and to map the second set of shadow registers to the shared address space upon granting the semaphore to the second processor.

7. The apparatus of claim 6, wherein the semaphore state machine responds to a request to preempt operations by the first processor on the shared device, to grant access to the second processor to preempt the operations of the first processor, and to allow the second processor to access to the shared device.

8. The apparatus of claim 6, wherein transactions requested by the first processor utilize information stored in the first set of shadow registers and transactions requested by the second processor utilize information stored in the second set of shadow registers.

9. The apparatus of claim 6 further comprising:
a shared address multiplexer configured to map the first set of shadow registers and the second set of shadow registers to the same shared address space as controlled by the granting of the semaphore.

10. The apparatus of claim 6, wherein operations associated with the shared device for the first processor are preempted by granting a semaphore lock to the second processor to begin the operations associated with the shared device and upon completion of operations by the second processor, the semaphore lock is returned to the first processor to resume its operations to the shared device.

11. A method for two processors to independently access a shared device, the method comprising:
mapping a first shadow register, comprising a first address mapped register configured to be linked to a shared address such that accesses to the first address mapped register are mapped to the shared address, to the shared address in response to acquisition of a semaphore by a first processor, wherein the first processor writes a first value to the first shadow register at the shared address;
unlinking the first shadow register from the shared address in response to the semaphore being released at completion of a first operation to a shared device by the first processor;
mapping a second shadow register, comprising a second address mapped register configured to be linked to the shared address such that accesses to the second address mapped register are mapped to the shared address, to the shared address in response to acquisition of the semaphore by a second processor, wherein the second processor writes a second value to the second shadow register at the shared address; and
unlinking the second shadow register from the shared address in response to the semaphore being released at completion of a second operation to the shared device by the second processor, wherein the first value is unchanged in the first shadow register and the second value is unchanged in the second shadow register at the completion of the second operation.

12. The method of claim 11, wherein the first operation is a data transfer from the shared device to the first processor according to the first value.

13. The method of claim 11, wherein the second operation is a data transfer from the shared device to the second processor according to the second value.

14. The method of claim 11, wherein the first operation is part of a longer operation to the first processor that is preempted by the second processor to accomplish the second operation and upon the completion of the second operation, and wherein the first processor reacquires the semaphore to complete the longer operation using the first value as previously written.

15. A computer readable non-transitory medium encoded with computer readable program data and code, the program data and code when executed operable to:
map a first shadow register, comprising a first address mapped register configured to be linked to a shared address such that accesses to the first address mapped register are mapped to the shared address, to the shared address in response to acquisition of a semaphore by a first processor, wherein the first processor writes a first value to the first shadow register at the shared address;
unlink the first shadow register from the shared address in response to the semaphore being released at completion of a first operation to a shared device by the first processor;
map a second shadow register, comprising a second address mapped register configured to be linked to the shared address such that accesses to the second address mapped register are mapped to the shared address, to the shared address in response to acquisition of the semaphore by a second processor, wherein the second processor writes a second value to the second shadow register at the shared address; and
unlink the second shadow register from the shared address in response to the semaphore being released at completion of a second operation to the shared device by the second processor, wherein the first value is unchanged in the first shadow register and the second value is unchanged in the second shadow register at the completion of the second operation.

16. A computer readable non-transitory medium encoded with computer readable program data and code, the program data and code when executed operable to:
perform data accesses by a first processor from a non-volatile memory device that is shared by direct access with the first processor and a second processor;
issue a doorbell interrupt to the first processor to request preemption of operations by the first processor on the shared non-volatile memory device; and
preempt the data accesses by the first processor to initiate a memory access by the second processor;
wherein:
the first processor is configured to access a first set of shadow registers to which the first processor is configured to have exclusive access rights, each shadow register of the first set of shadow registers comprising an address mapped register configured to be linked to a shared address space such that accesses to the address mapped register are mapped to the shared address space;
the second processor is configured to access a second set of shadow registers to which the second processor is configured to have exclusive access rights, each shadow register of the second set of shadow registers comprising an address mapped register configured to be linked to the shared address space such that accesses to the address mapped register are mapped to the shared address space;

performing the data accesses by the first processor comprises accessing the first set of shadow registers; and initiating the memory access by the second processor comprises accessing the second set of shadow registers.

17. An apparatus allowing two processors to independently access a shared device, the apparatus comprising:

means for a first processor to access a shared device and to have exclusive access rights to a first set of shadow registers, each shadow register of the first set of shadow registers comprising an address mapped register configured to be linked to a shared address space such that accesses to the address mapped register are mapped to the shared address space;

means for a second processor to access the shared device and to have exclusive access rights to a second set of shadow registers, each shadow register of the second set of shadow registers comprising an address mapped register configured to be linked to the shared address space such that accesses to the address mapped register are mapped to the shared address space; and means for a shared device controller to map the first set of shadow registers to the shared address space upon granting a semaphore to the first processor and to map the second set of shadow registers to the shared address space upon granting the semaphore to the second processor.

* * * * *